US006675360B1

United States Patent
Cantone et al.

(10) Patent No.: US 6,675,360 B1
(45) Date of Patent: Jan. 6, 2004

(54) SYSTEM OF MANAGEMENT OF THE TRIMMING OF INTEGRATED FUSES WITHIN A SCAN TEST ARCHITECTURE

(75) Inventors: Giuseppe Cantone, Siracusa (IT); Roberto Cappelletti, Cornaredo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 441 days.

(21) Appl. No.: 09/718,078

(22) Filed: Nov. 21, 2000

(30) Foreign Application Priority Data

Nov. 23, 1999 (IT) .......................... VA99A0035

(51) Int. Cl.[7] .............................................. G06F 17/50
(52) U.S. Cl. ........................ 716/1; 702/132; 702/130; 716/726; 716/728; 716/729
(58) Field of Search ................... 716/1–17; 365/185.08, 365/185.11, 189.08; 327/525; 702/99, 116, 130, 132; 714/30, 718, 726, 728, 729

(56) References Cited

U.S. PATENT DOCUMENTS

| | | | | |
|---|---|---|---|---|
| 5,801,989 A | * | 9/1998 | Lee et al. | 365/185.22 |
| 5,982,163 A | * | 11/1999 | Shinozaki | 323/354 |
| 6,006,169 A | * | 12/1999 | Sandhu et al. | 702/132 |
| 6,072,349 A | * | 6/2000 | Pippin et al. | 327/307 |
| 6,163,485 A | * | 12/2000 | Kawahara et al. | 365/185.24 |
| 6,201,733 B1 | * | 3/2001 | Hiraki et al. | 365/185.08 |
| 6,346,847 B1 | * | 2/2002 | Capici et al. | 327/525 |

* cited by examiner

Primary Examiner—Vuthe Siek
(74) Attorney, Agent, or Firm—Allen, Dyer, Doppelt, Milbrath & Gilchrist, P.A.; Lisa K. Jorgenson

(57) ABSTRACT

Functions for simulating, burning and controlling integrated fuses of a device are provided by a dedicated circuit which, instead of differing from other circuits, is integrated by sharing part of the registers with the circuit that normally exists to scan test the integrity of the state of the device. The architecture is simplified and only requires an additional pin as compared to a common scan test circuit.

48 Claims, 8 Drawing Sheets

SYSTEM OF MANAGEMENT OF THE TRIMMING OF INTEGRATED FUSES WITHIN A SCAN TEST ARCHITECTURE

FIELD OF THE INVENTION

The present invention in general relates to integrated circuits, and, in particular, to trimming operations of integrated fuses.

BACKGROUND OF THE INVENTION

Integrated circuits are often required to store data on a permanent basis, or to form permanent connections on the integrated circuit once its fabrication process is concluded. This may be done using a plurality of fusible connections that can be subsequently and selectively burnt according to a certain scheme. These fusible connections are thin strips of conductor material, typically polysilicon, providing low resistance current paths that may be interrupted by burning the polysilicon by forcing a current pulse of sufficient magnitude therethrough.

The process of selecting the fuses to be burnt as well as the burning of selected fuses is referred to as trimming, and it is commonly carried out in analog devices, such as in operational amplifiers and also specific telecommunications devices, for example. These analog devices are often required to have certain electrical circuit parameters ranging in a well-defined interval, while the fabrication process spread may often go beyond these stringent limits.

To understand the utility of the trimming process, reference may be made to an integrated circuit, wherein the adjustment of a time constant (velocity) could be implemented by adjusting the actual value of an integrated resistance. An integrated resistance may be physically structured such that the current circulates through a number of resistances connected among each other by fuses in a certain network scheme. By interrupting the electrical continuity of selected fuse connections, i.e., by burning selected fuses and leaving the other fuses intact, the total resistance may be adjusted.

During a trimming process three distinct operations may be recognized. A first operation includes a write and simulation operation that forces control signals for the components to be trimmed to determine which fuses should be burned to obtain the most appropriate configuration. A second operation includes a burning operation of the fuses according to the configuration previously determined. A third operation includes testing of the state of the fuses, which may even be carried out before the burning process. This is done to verify the integrity of the elements to be burnt, and this operation is repeated after the burning process to verify that the configuration obtained is the desired one.

The trimming process requires particular attention because the fuses are subject to an irreversible burning. The need of forming an ever-increasing number of fuses for the trimming process of complex integrated systems has imposed the implementation of circuits, procedures and methods to safely burn the correct fuses, and above all, to simulate the circuit behavior before irreversibly burning the selected fuses.

Generally, these circuits have a latch that stores the state of the fuses and a logic circuitry which, during the simulation phase, substitutes the latch content or else forces the trimming signal to an externally set value. Some examples of such circuits as well as methods are disclosed in the following U.S. Pat. Nos. 5,838,076; 5,731,733; 5,517,455; 5,412,594; 5,384,727; 5,361,001; 5,047,664; 4,532,607; and 4,446,534. The systems disclosed in these patents use circuits specifically dedicated to check, simulate and eventually burn the fuses.

Integrated systems often include a special circuit to test the integrity and proper functioning of logic circuitry contained therein. An example of a known scan test device is referred to as a Scan Chain. This is formed by connecting the flip-flops that make up the logic circuitry to be tested to configure them as a shift register. During testing, the shift register is loaded with a number of bit vectors (Scan Path) allowing the interaction of the logic circuits with the loaded register and modification of its content. The bit vector contained in the register, which at each interaction varies depending on the previously stored vector, may be read via a procedure similar to the one used during the loading process. If the read vector is not as expected, one of the components of the device must have failed.

The insertion of the Scan Chain in the logic circuitry to be tested, as well as the generation of the Scan Path, are formed automatically using dedicated systems. These systems use appropriate algorithms to optimize the formation of the shift register and the number of vectors required to ensure that all the components are involved in the test.

As discussed above with respect to existing systems, the control circuits of the trimming process are distinct from the circuits that implement the scan test of the functional state of the digital components of the logic circuitry of the integrated system. It is evident that an approach that implements with a unique circuit the operations of Scan Chain, control and simulation, as well as the burning of the fuses would be desirable. Such an approach would result in simplified circuitry.

SUMMARY OF THE INVENTION

It is an object of the present invention to provide a circuit that fulfills the functions of fuse check and burning of the fuses according to a post fabrication trimming process using latches that are integrated in a structure suitable to perform a scan test of the functional logic circuitry of the device.

While existing fuse check and burning circuits are normally dedicated to the trimming operations alone, the proposed invention simplifies the entire integrated circuit architecture by using for trimming operations part of the structures that are formed and utilized for performing scan tests. The new system of the invention only requires an additional pin besides the number of pins that are normally required to manage Scan Chain operations for controlling the burning of the fuses according to a normal trimming process.

In addition, a further simplification is obtained because the read/write operations and burning of the fuses refer to the same digital channels and to the same procedures that perform the loading and unloading of the Scan Chain.

More specifically, the object of the present invention is to provide a multifunction circuit for controlling, simulating and burning integrated fuses according to a post fabrication trimming procedure, and for performing scan tests of an integrated device. The circuit comprises a plurality of scan flip-flops connected to form a scan chain. The command inputs of which are coupled to a first circuit to be subjected to functionality tests. The outputs of which, besides each being coupled to a second scan input of the successive flip-flop in the chain, are coupled to as many inputs of a second circuit to be subjected to functionality tests.

At least a scan bit vector is coupled through a first pin of the integrated device to the input of the scan bit vector of the first flip-flop of the scan chain. The output of the last flip-flop of the chain is connected to a second pin of the integrated device. An enabling signal of the scan is applied through a third pin in common to a third conditioning input of all the flip-flops of the chain. A scan timing signal is applied through a fourth pin of the device in common to timing inputs of all the flip-flops of the chain.

The multifunction characteristics of the circuit is due to the fact that the above scan test circuit further comprises a first array of a number N, equal to the number of integrated fuses, of scan flip-flops forming a fuses register. The Q1 ... N outputs of which are coupled to as many inputs of the functional circuits of the integrated device conditioned by the trimming.

A second array of a number K of scan flip-flops forms, in conjunction with a modulus N counter, a counter register. A third array of a number M of scan flip-flops, each configured as a memory cell, forms a control register of the trimming parameters.

A timing signal is applied in common to relative inputs of all the flip-flops. The first scan command is applied to the relative input of the first flip-flop of the fuses register. The output of the last flip-flop thereof is coupled to the input of the scan command of the first flip-flop of the counter register. The output of the last flip-flop thereof is coupled to the input of the scan command of the first flip-flop of the control register. The output of the last flip-flop thereof is coupled to the input of the scan command of the first flip-flop of the plurality of chained flip-flops, thus forming the chain.

The outputs of the counter register are coupled to the inputs of a decoder and logically combined with respective outputs of the fuses register, with the enabling signal, and with an additional signal for conditioning the sequential burning of the selected fuses. This additional signal is applied through a dedicated fifth pin of the integrated device.

A number N of burning commands are generated that are fed through a bus to the respective inputs of a number N of logic gates for controlling the command inputs of the N scan flip-flops forming the fuses register. As compared to a dedicated trimming circuit approach, the approach of the present invention is advantageous when the integrated device includes a scan chain, or when there are enough fuses to justify a serial loading of data and a burning process carried out sequentially fuse by fuse.

BRIEF DESCRIPTION OF THE DRAWINGS

The various aspects and advantages of the invention will become clearer through the following description of an embodiment of the invention and by referring to the attached drawings, wherein:

FIG. 4d is a circuit diagram of the functional scheme of FIG. 4a;

DETAILED DESCRIPTION OF THE PREFERRED EMBODIMENTS

Figure 1:
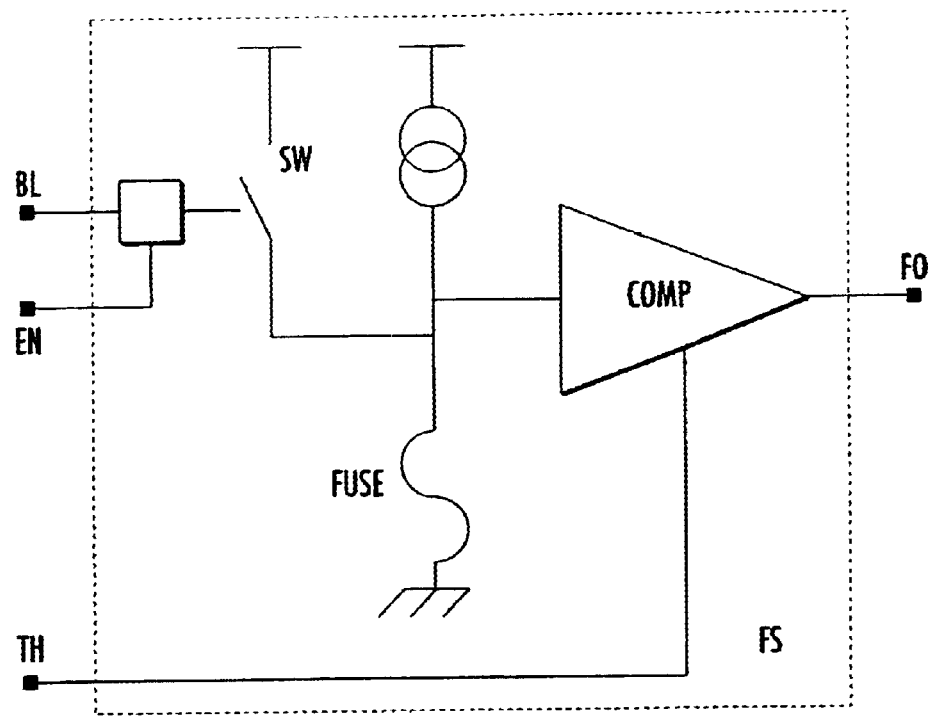
FIG. 1 shows the functional scheme of a fuse cell used for trimming operations in accordance with the present invention.

The circuit of the invention uses common fusible cells as the one depicted in FIG. 1. Each cell is formed by a fuse FUSE, which is a conductive element whose state may be irreversibly changed from a low resistance to a very high resistance. The circuit also includes a power switch SW which causes a change in the state (burning) of the fuse when enabled, and a comparator COMP that detects the state of the fuse by outputting a digital signal FO. The SW switch eventually permits the circulation of a sufficiently high current capable of irreversibly burning the fuse.

Figure 2A:
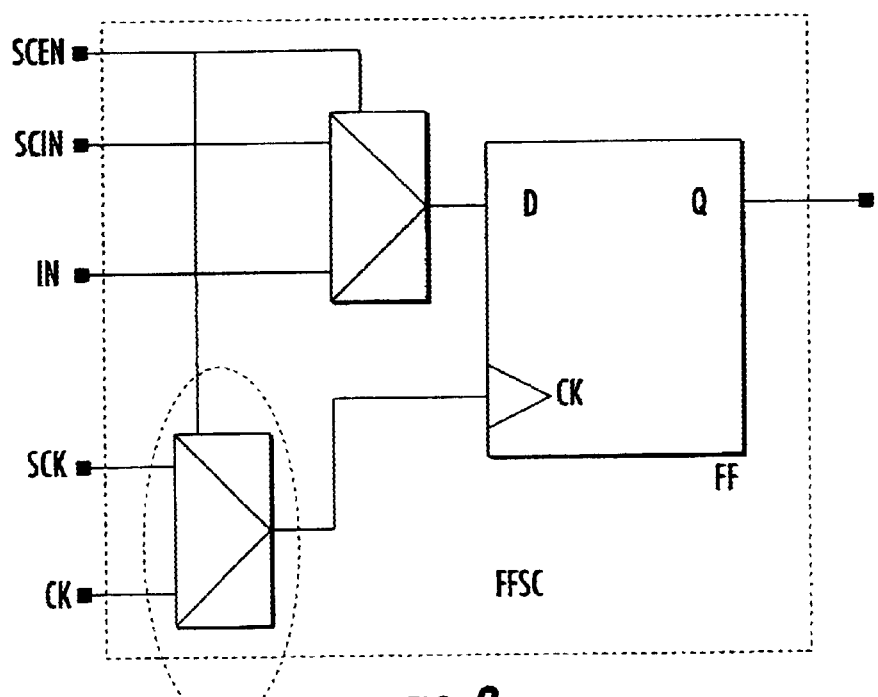
FIG. 2a shows the structure of a scan flip-flop used for the scan test in accordance with the present invention.

The cell also has an input BL for commanding the actual burning of the fuse, and may have other inputs for enabling EN and/or for modifying the triggering threshold TH of the comparator. The Scan test architecture commonly uses special scan flip-flops, referred to as FFSC, whose structure is shown in FIG. 2a. Besides the usual signals, the following are included: the FFSC test input SCIN, a scan enable input SCEN, and in the presence of different clock domains an input for a dedicated clock SCK for the scan test.

Figure 2B:
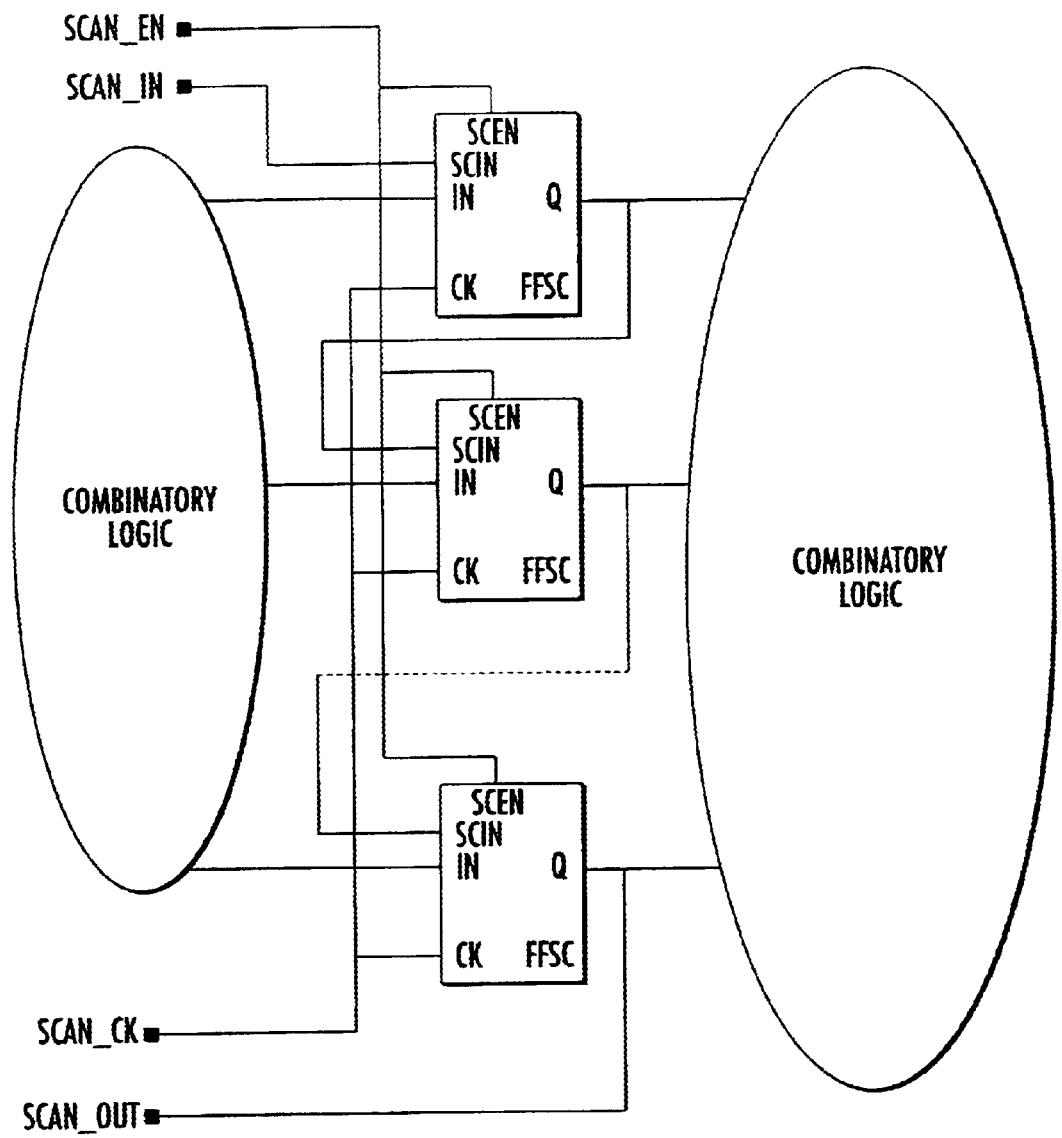
FIG. 2b shows an architecture of the scan test in accordance with the present invention.

Special scan flip-flops are linked to each other to form a chain by connecting the output Q of a flip-flop to the SCIN of the next flip-flop in the chain, as shown in FIG. 2b. The Scan Enable inputs SCEN are connected in common, and the clock SCK inputs are connected in common. The resulting chain of flip-flops is enabled by a Scan Enable signal that is applied on an external pin SCAN_EN, and is distributed to all the flip-flops. The input of the SCAN_IN chain coincides with the input of the first flip-flop thereof, while the output of the chain SCAN_OUT coincides with the output of the last flip-flop.

Figure 3:
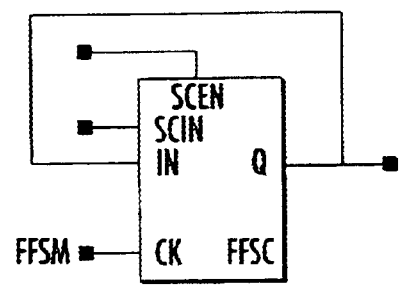
FIG. 3 shows the structure of a memory cell used in the multifunctional circuit architecture for carrying out trimming operations in accordance with the present invention.
Figure 4A:
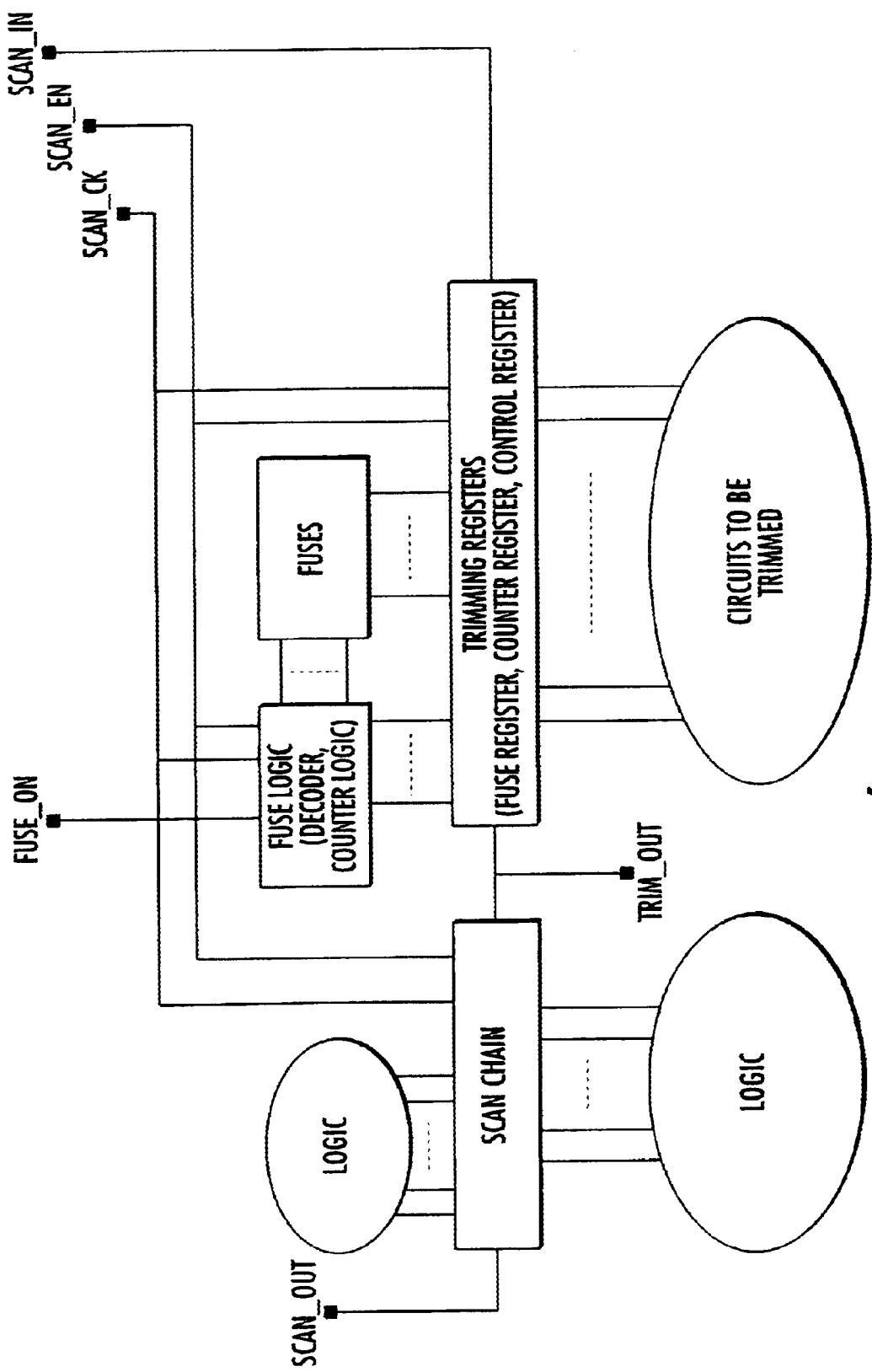
FIG. 4a is the scheme of a multifunctional circuit in accordance with the present invention.

To control the trimming parameters, use is made of FFSM memory cells formed by an FFSC flip-flop having the output Q coupled to the IN input, as shown in FIG. 3. A high level functional diagram of the invention according to an exemplified embodiment is depicted in FIG. 4a. In this diagram, the block FUSES represents all the fuse-cells FS, the blocks SCAN CHAIN and LOGIC represent respectively all the flip-flops FFSC configured as a shift register, and the COMBINATORY LOGIC that is interfaced with them, as illustrated in FIG. 2b. The block labeled FUSE LOGIC selects the fuses to be burnt when the dedicated external command FUSE_ON is enabled.

Moreover, the flip-flops of the FUSES REGISTER, of the COUNTER REGISTER, and of the CONTROL REGISTER are contained in a block (TRIMMING REGISTER) in series and, according to the illustrated example, upstream of the SCAN CHAIN. This forms a single chain subject to a Scan test. The architecture of FIG. 4a may vary because the flip-flops can be configured differently without altering the functionality of the multifunction circuit of the invention. This approach is that of integrating the latches that store the condition of the fuses in a Scan test architecture.

Figure 4B:
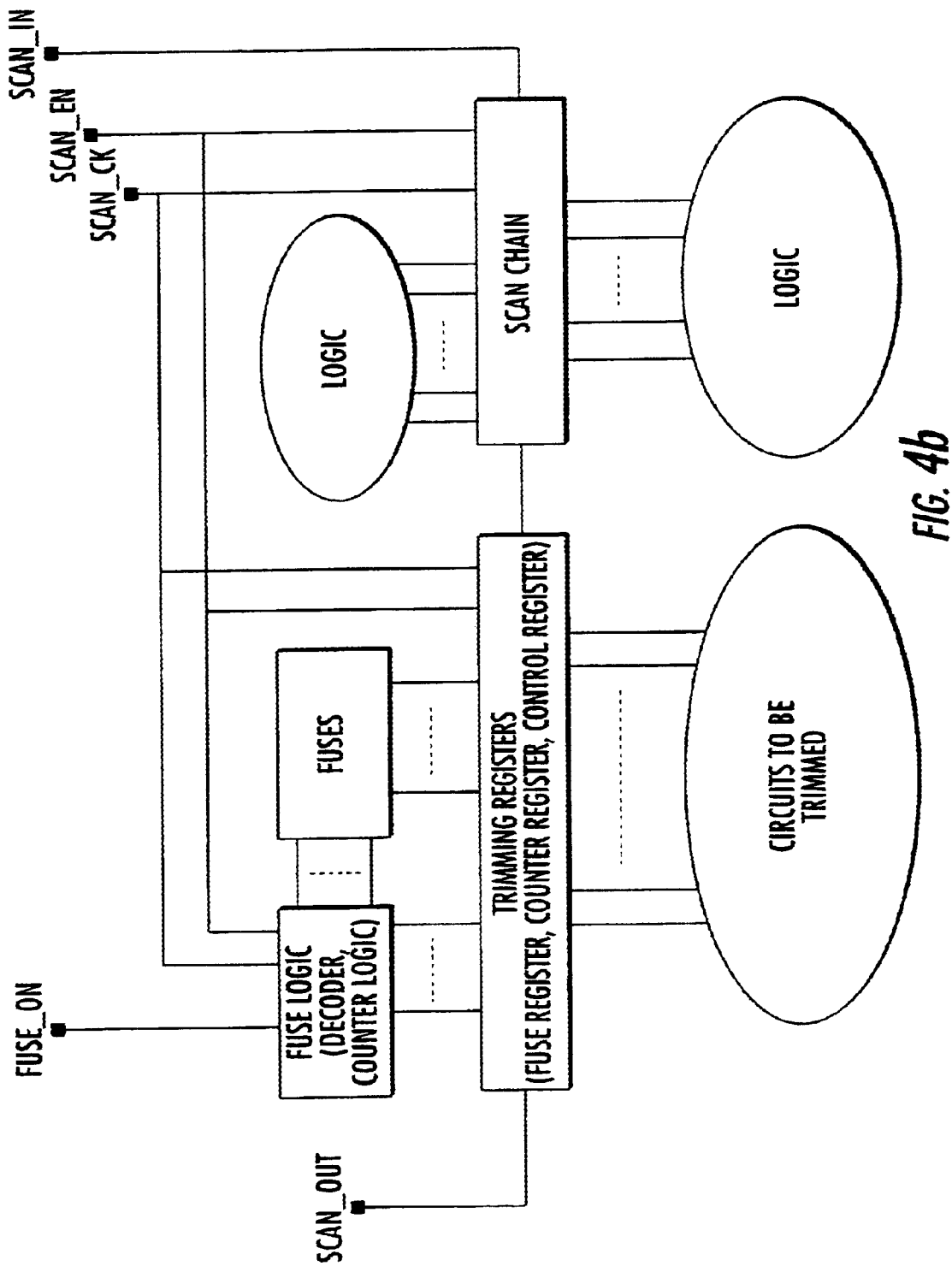
FIG. 4b shows an alternative embodiment of the multifunctional circuit in accordance with the present invention.
Figure 4C:
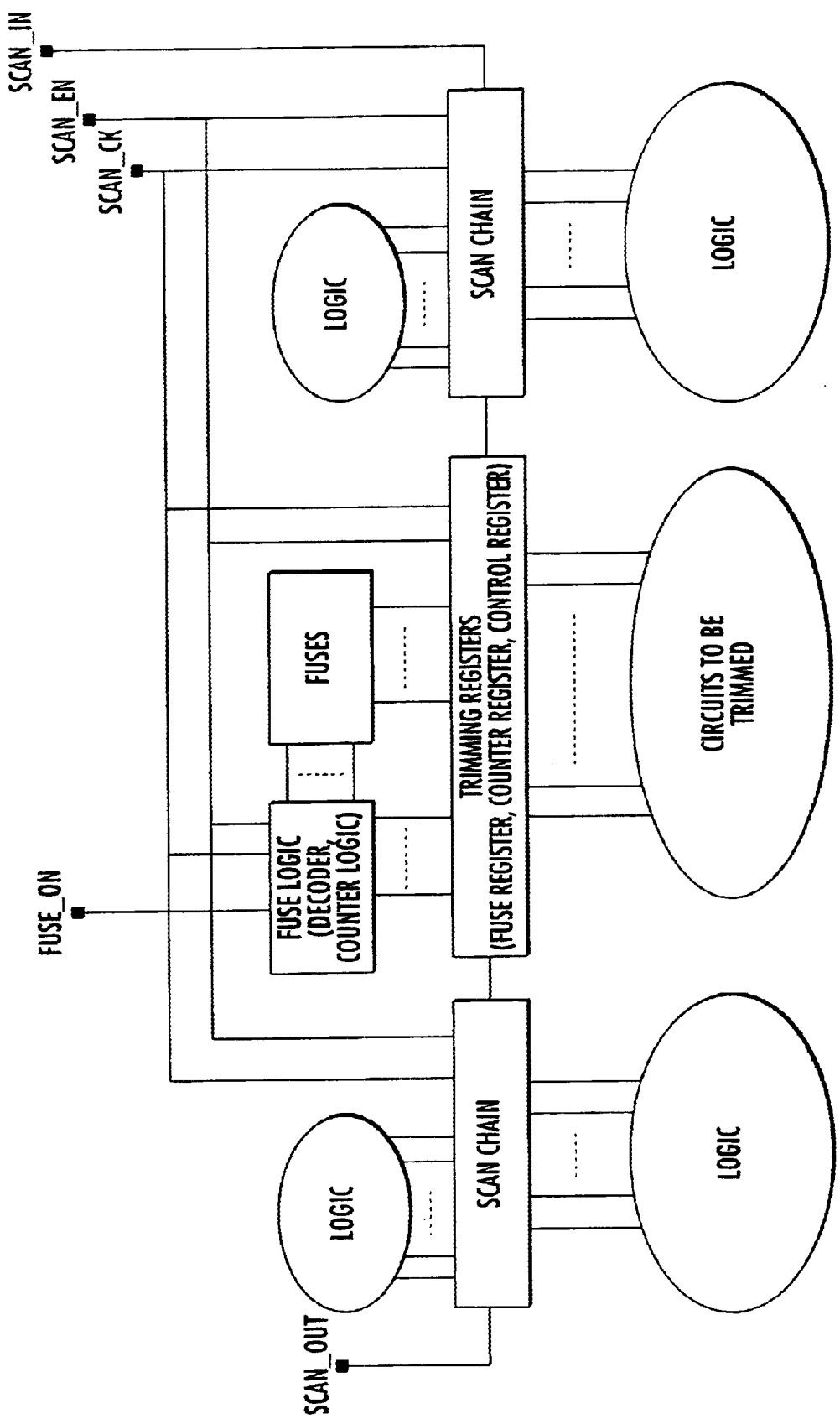
FIG. 4c shows another alternative embodiment of the multifunctional circuit in accordance with the present invention.
Figure 4D:
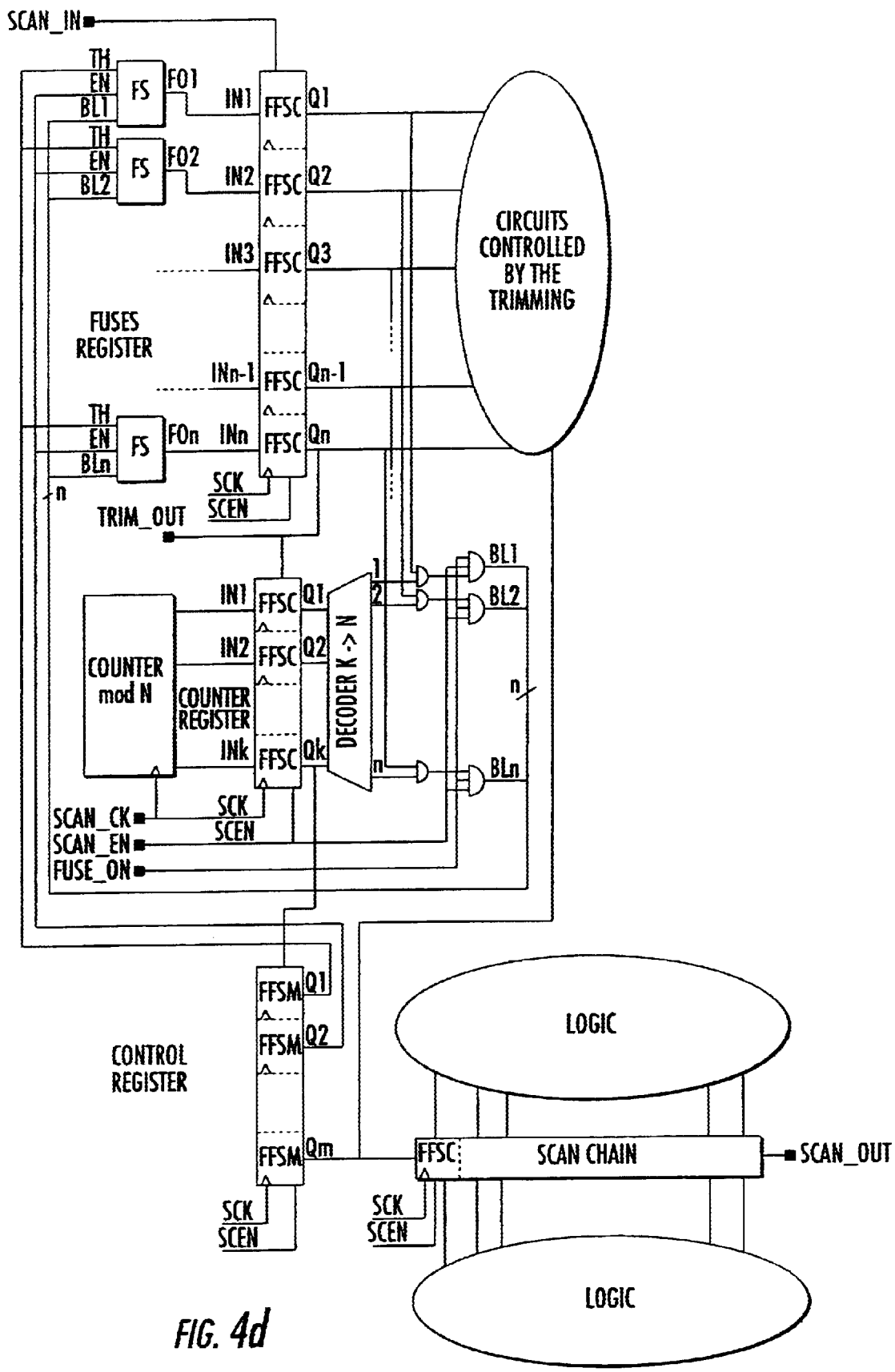

For example, the registers required for the trimming process may be positioned downstream of the Scan Chain of FFSCs, or even placed between distinct locks of flip-flops FFSC of the Scan chain, as in the examples of FIGS. 4b and 4c. FIG. 4d shows a more detailed circuit diagram of the block that carries out the trimming operations described in FIG. 4a.

The number of FFSC registers required for the trimming operation is equal to the number N of FS fuses, increased by the minimum number K={$\log_2 N$} of flip-flops FFSC that are required to form an N module counter (COUNTER REGISTER). This symbolizes a rounding off operation to the nearest greater integer. In addition, if there are other enabling or controlling signals of the elementary cell or the structures connected to it, the number M of necessary flip-flops that should be added is equal to the number of additional signals.

When the Scan Enable SCAN_EN is inactive, the N flip-flops form the FUSES REGISTER, which stores the state of the fuses. Such a storage operation may be performed at different times and with a different frequency depending on the applications. The outputs of these flip-flops control the switches that condition the values of the electrical parameters being subjected to trimming. If the SCAN_EN is active, the N flip-flops form a part of the Scan Chain, which may be loaded with the configuration required and accessed in the same manner followed to load and access a serial register.

The COUNTER REGISTER is a binary module N, formed by K FFSC cells, and carries out the counting operations on a certain edge of the Scan clock signal SCAN_CK. Such a register controls a DECODER K→N that controls a logic circuit that sequentially generates the enabling signals BLOW1, . . . , BLOWn of the single fusible cells FS. This depends on the output state of the FUSES REGTSTER, of the FUSE_ON signal, and of the Scan Enable SCAN_EN signal.

Optionally, this part of the circuit, which is no longer required once the burning process is completed, may not be realized if the number of fuses is low enough to allow for a burning in parallel, or where there are test pads dedicated to this function.

Figure 5:
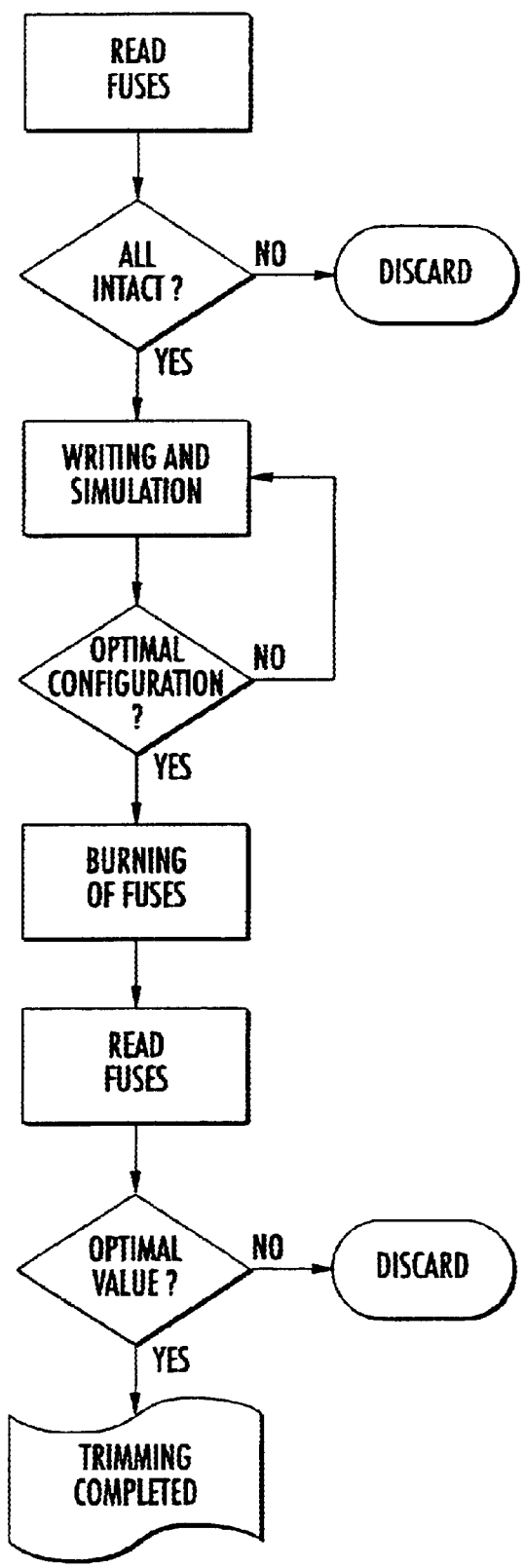
FIG. 5 is a flow-chart of the trimming procedure in accordance with the present invention.

A number M of FFSM memory cells that may be formed as shown in FIG. 3, are coupled to the fusible cells FS to control the trimming parameters. The circuit of the invention executes the trimming of a device following the routine depicted in FIG. 5. The routine encompasses four distinct phases: initial control, search for the optimal configuration, burning of the fuses, and final test.

The initial control is carried out by reading the state of the fuses (READ FUSES) by testing the condition of the fuses before the start of the trimming process. Eventually, the device is discarded if such a test generates a negative result. The search for the optimal configuration is done via an iterative method. First, pre-established values are loaded into the flip-flops that simulate a corresponding state of the fuses, and a simulation of the functioning of the circuit (Write and Simulation) is carried out. Thereafter, a test is undertaken to check whether the parameters subject to trimming fulfill the project specifications. If this is not the case, the simulation of the circuit is repeated after having changed the values stored in the flip-flops.

Once the burning scheme that makes the circuit function in the desired manner is determined, the effective burning of the fuses is carried out. This is followed by a final testing to check whether all and only the required burnings have taken place. If this final test is positive, the trimming is deemed perfectly completed. Otherwise, the part is rejected.

Figure 6A:
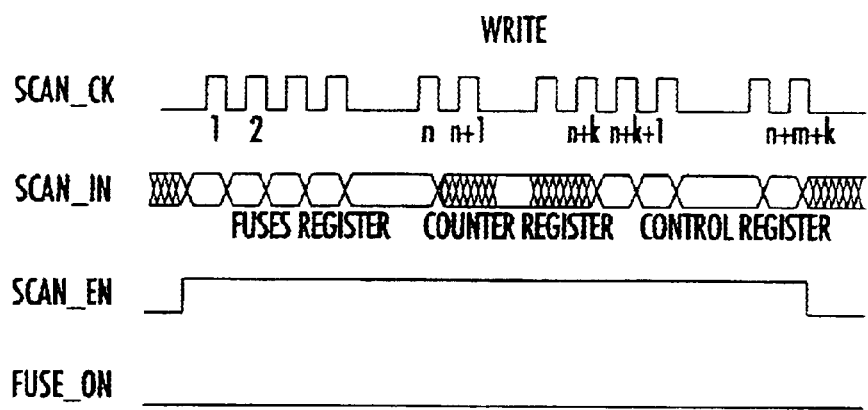
FIG. 6a shows the timing diagrams of the signals involved during the write operation of the latches for simulating the state of the fuses in accordance with the present invention.
Figure 6B:
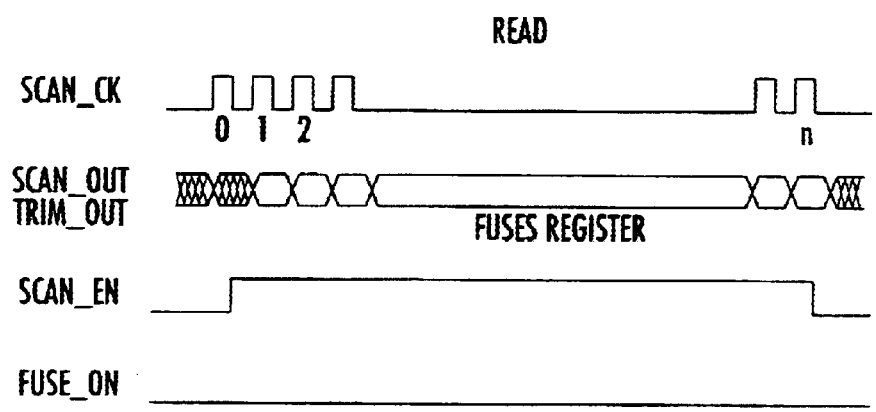
FIG. 6b shows the timing diagrams of the signals involved during the read operation of the state of the fuses in accordance with the present invention.
Figure 6C:
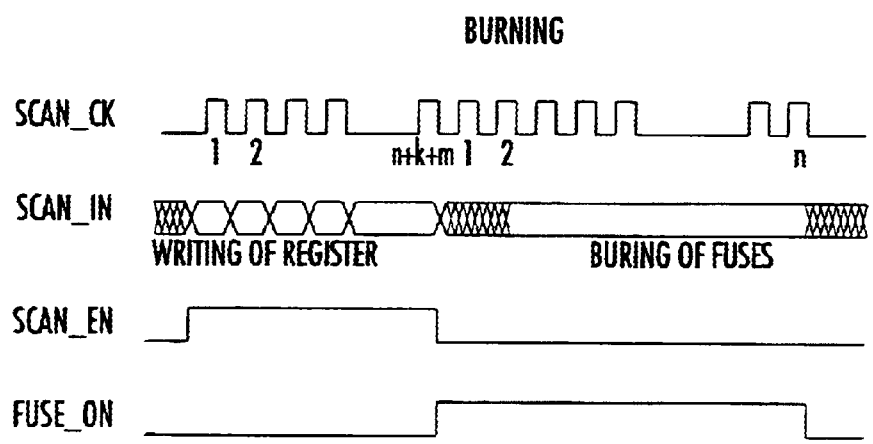
FIG. 6c shows the timing diagrams of the signals involved during the burning of the fuses in accordance with the present invention.

The writing, reading, and burning operations implemented by the circuit of the invention are commanded by signals whose timing waveforms may be as indicated in FIGS. 6a, 6b and 6c, respectively. The FUSES REGISTER is configured as a Scan Chain by the Scan Enable signal SCAN_EN, as in the example shown in FIG. 6a, and is loaded with a vector of test data by varying the SCAN_IN signal.

Once the outputs of the flip-flops are set to a predetermined value, the SCAN_EN signal is disabled, thus allowing for the simulation phase of the circuit. This operation must be repeated until the optimal configuration for the trimming is determined. During this phase it is also possible to set the value of the FFSM memory cells that form the CONTROL REGISTER for the current write operation or for the subsequent read and burning operations.

The read operation may be effected, as in the example of the timing diagram of FIG. 6b, by loading a vector that corresponds to the state of the fuses in the FUSES REGISTER with a first clock pulse. This enables the Scan Enable SCAN_EN signal and supplies the number of clock pulses required to detect the state of the fuses stored in the FUSES REGISTER. It is also possible to carry out the read operation of the fuses with a different threshold value by varying the bits previously stored in the flip-flops which form the CONTROL REGISTER.

The operations that lead to the burning of the fuses are highlighted in FIG. 6c. Prior to the burning there is a phase whereby the SCAN_EN is active. This allows for the write operation of the FUSES REGISTER with the required burning sequence, the COUNTER REGISTER with the initial counting condition, and the CONTROL REGISTER with values that may eventually be different from default conditions.

As soon as this write operation is completed, the SCAN_EN is disabled while simultaneously the FUSE_ON signal is enabled. For each edge of the Scan Clock SCAN_CK the COUNTER REGISTER will increment its value and the decoder coupled to it will select one of the fuse cells at a time. The burning of the selected fuse takes place at the next edge of the clock signal SCAN_CK only if the relative flip-flop of the FUSES REGISTER contains the logic value corresponding to a burnt fuse. After N clock pulses the burning phase of the trimming process terminates and is followed by the final test of the state of fuses.

That which is claimed is:

1. A multifunction circuit for controlling, simulating and burning integrated fuses according to a post fabrication trimming procedure and for performing scan tests of at least one circuit to be trimmed in an integrated device, the multifunction circuit comprising:
   a scan chain comprising a plurality of scan flip-flops connected together in series; and
   a trimming circuit connected to said scan chain, to the at least one circuit to be trimmed and to the integrated fuses, said trimming circuit comprising
      a fuse register comprising a first array of N scan flip-flops including N outputs connected to N inputs of the at least one circuit to be trimmed, with N being equal to a number of integrated fuses, and a first scan flip-flop of said first array includes a scan command input for receiving a scan command, a counter register comprising a second array of K scan flip-flops, a first scan flip-flop of said second array includes a scan command input connected to the output of a last scan flip-flop of said first array, and a control register comprising a third array of M scan flip-flops being configured as memory cells for storing trimming parameters, and a first scan flip-flop of said third array includes a scan command input connected to an output of a last flip-flop of said second array and an output of a last scan flip-flop of said third array is connected to a scan command input of a first scan flip-flop of said scan chain.

2. A multifunction circuit according to claim 1, wherein said counter register further comprises a modulus N counter connected to said second array.

3. A multifunction circuit according to claim 1, wherein each scan flip-flop of said scan chain, and said first, second and third arrays includes an input for receiving in common a timing signal.

4. A multifunction circuit according to claim 1, further comprising a decoder connected to outputs of said third array.

5. A multifunction circuit according to claim 4, further comprising a logic circuit connected to outputs of said decoder circuit, to outputs of said first array, said logic circuit also including inputs for receiving an enabling signal and a condition signal for conditioning a sequential burning of selected integrated fuses, the condition signal being applied through a fifth external pin of the integrated device.

6. A multifunction circuit according to claim 5, wherein said fuse register further comprises:

N input logic gates, each input logic gate being connected to a command input of a respective scan flip-flop of said first array; and a bus connected to an output of said logic circuit for providing an N number of generated burning commands to respective inputs of said N input logic gates for controlling the command inputs thereof.

7. A multifunction circuit according to claim 1, further comprising a first circuit to be subjected to functionality tests and being connected to said scan chain, wherein each scan flip-flop in said scan chain includes a command input connected to a respective output of said first circuit.

8. A multifunction circuit according to claim 1, further comprising a second circuit to be subjected to functionality tests and being connected to said scan chain, wherein each scan flip-flop in said scan chain includes an output connected to a respective input of said second circuit.

9. A multifunction circuit according to claim 1, wherein a first through a next to last scan flip-flop of said plurality of scan flip-flops in said scan chain each includes an output connected to a second scan input of a successive scan flip-flop.

10. A multifunction circuit according to claim 9, wherein said first scan flip-flop includes a second scan input for receiving at least a scan bit vector connected through a first external pin of the integrated device.

11. A multifunction circuit according to claim 9, wherein an output of a last scan flip-flop of said plurality of scan flip-flops in said scan chain is connected to a second external pin of the integrated device.

12. A multifunction circuit according to claim 1, wherein each scan flip-flop in said scan chain includes a conditioning input for receiving an enabling signal of a scan being applied through a third external pin of the integrated circuit.

13. A multifunction circuit according to claim 1, wherein each scan flip-flop in said scan chain includes a timing input for receiving a scan timing signal being applied through a fourth external pin of the integrated circuit.

14. A multifunction circuit according to claim 1, wherein said trimming circuit is placed upstream of said scan chain.

15. A multifunction circuit according to claim 1, wherein said trimming circuit is placed downstream of said scan chain.

16. A multifunction circuit according to claim 1, wherein said plurality of scan flip-flops of said scan chain are divided into first and second blocks of scan flip-flops, and wherein said trimming circuit is connected between said first and second blocks.

17. An integrated circuit comprising:

a plurality of external pins;

a plurality of integrated fuses;

at least one circuit to be trimmed;

a multifunction circuit for controlling, simulating and burning said integrated fuses according to a post fabrication trimming procedure and for performing scan tests of said at least one circuit to be trimmed, said multifunction circuit comprising:

a scan chain comprising a plurality of scan flip-flops connected together in series, and a trimming circuit connected to said scan chain, to said at least one circuit to be trimmed and to said plurality of integrated fuses, said trimming circuit comprising a fuse register comprising a first array of N scan flip-flops including N outputs connected to N inputs of said at least one circuit to be trimmed, with N being equal to a number of said plurality of integrated fuses, and a first scan flip-flop of said first array includes a scan command input for receiving a scan command, a counter register comprising a second array of K scan flip-flops, a first scan flip-flop of said second array includes a scan command input connected to the output of a last scan flip-flop of said first array, and a control register comprising a third array of M scan flip-flops being configured as memory cells for storing trimming parameters, and a first scan flip-flop of said third array includes a scan command input connected to an output of a last flip-flop of said second array and an output of a last scan flip-flop of said third array is connected to a scan command input of a first scan flip-flop of said scan chain.

18. An integrated circuit according to claim 17, wherein said counter register further comprises a modulus N counter connected to said second array.

19. An integrated circuit according to claim 17, wherein each scan flip-flop of said scan chain, and said first, second and third arrays includes an input for receiving in common a timing signal.

20. An integrated circuit according to claim 17, further comprising a decoder connected to outputs of said third array.

21. An integrated circuit according to claim 20, further comprising a logic circuit connected to outputs of said decoder circuit, to outputs of said first array, said logic circuit also including inputs for receiving an enabling signal and a condition signal for conditioning a sequential burning of selected integrated fuses, the condition signal being applied through a fifth external pin of said plurality of external pins.

22. An integrated circuit according to claim 21, wherein said fuse register further comprises:

N input logic gates, each input logic gate being connected to a command input of a respective scan flip-flop of said first array; and a bus connected to an output of said logic circuit for providing an N number of generated burning commands to respective inputs of said N input logic gates for controlling the command inputs thereof.

23. An integrated circuit according to claim 17, further comprising a first circuit to be subjected to functionality tests and being connected to said scan chain, wherein each scan flip-flop in said scan chain includes a command input connected to a respective output of said first circuit.

24. An integrated circuit according to claim 17, further comprising a second circuit to be subjected to functionality tests and being connected to said scan chain, wherein each scan flip-flop in said scan chain includes an output connected to a respective input of said second circuit.

25. An integrated circuit according to claim 17, wherein a first through a next to last scan flip-flop of said plurality of scan flip-flops in said scan chain each includes an output connected to a second scan input of a successive scan flip-flop.

26. An integrated circuit according to claim 17, wherein said first scan flip-flop includes a second scan input for receiving at least a scan bit vector connected through a first external pin of said plurality of external pins.

27. An integrated circuit according to claim 17, wherein an output of a last scan flip-flop of said plurality of scan flip-flops in said scan chain is connected to a second external pin of said plurality of external pins.

28. An integrated circuit according to claim 17, wherein each scan flip-flop in said scan chain includes a conditioning input for receiving an enabling signal of a scan being applied through a third external pin of said plurality of external pins.

29. An integrated circuit according to claim 17, wherein each scan flip-flop in said scan chain includes a timing input for receiving a scan timing signal being applied through a fourth external pin of said plurality of external pins.

30. An integrated circuit according to claim 17, wherein said trimming circuit is placed upstream of said scan chain.

31. An integrated circuit according to claim 17, wherein said trimming circuit is placed downstream of said scan chain.

32. An integrated circuit according to claim 17, wherein said plurality of scan flip-flops of said scan chain are divided into first and second blocks of scan flip-flops, and wherein said trimming circuit is connected between said first and second blocks.

33. A method of making a multifunction circuit for controlling, simulating and burning integrated fuses according to a post fabrication trimming procedure and for performing scan tests of at least one circuit to be trimmed in an integrated circuit, the method comprising:

connecting a plurality of scan flip-flops together in series to define a scan chain; and connecting a trimming circuit to the scan chain, to the at least one circuit to be trimmed and to the integrated fuses, the trimming circuit comprising a fuse register comprising a first array of N scan flip-flops including N outputs-connected to N inputs of the at least one circuit to be trimmed, with N being equal to a number of integrated fuses, and a first scan flip-flop of the first array includes a scan command input for receiving a scan command, a counter register comprising a second array of K scan flip-flops, a first scan flip-flop of the second array includes a scan command input connected to the output of a last scan flip-flop of the first array, and a control register comprising a third array of M scan flip-flops being configured as memory cells for storing trimming parameters, and a first scan flip-flop of the third array includes a scan command input connected to an output of a last flip-flop of the second array and an output of a last scan flip-flop of the third array is connected to a scan command input of a first scan flip-flop of the scan chain.

34. A method according to claim 33, further comprising connecting a modulus N counter to the second array.

35. A method according to claim 33, wherein each scan flip-flop of the scan chain, and the first, second and third arrays includes an input for receiving in common a timing signal.

36. A method according to claim 33, further comprising connecting a decoder to outputs of the third array.

37. A method according to claim 36, further comprising connecting a logic circuit to outputs of the decoder circuit, to outputs of the first array, the logic circuit also including inputs for receiving an enabling signal and a condition signal for conditioning a sequential burning of selected integrated fuses, the condition signal being applied through a fifth external pin of the integrated circuit.

38. A method according to claim 37, further comprising:

connecting a respective input logic gate to each command input of each scan flip-flop of the first array; and connecting a bus to an output of the logic circuit for providing an N number of generated burning commands to respective inputs of the input logic gates for controlling the command inputs thereof.

39. A method according to claim 33, further comprising connecting a first circuit to be subjected to functionality tests to the scan chain, wherein each scan flip-flop in the scan chain includes a command input connected to a respective output of the first circuit.

40. A method according to claim 33, further comprising connecting a second circuit to be subjected to functionality tests to the scan chain, wherein each scan flip-flop in the scan chain includes an output connected to a respective input of the second circuit.

41. A method according to claim 33, further comprising connecting an output of a first through a next to last scan flip-flop of the plurality of scan flip-flops in the scan chain to a second scan input of a successive scan flip-flop.

42. A method according to claim 41, further comprising connecting a second scan input of the first scan flip-flop to a first external pin of the integrated circuit for receiving at least a scan bit vector.

43. A method circuit according to claim 41, further comprising connecting an output of a last scan flip-flop of the plurality of scan flip-flops in the scan chain to a second external pin of the integrated circuit.

44. A method according to claim 33, wherein each scan flip-flop in the scan chain includes a conditioning input for receiving an enabling signal of a scan being applied through a third external pin of the integrated circuit.

45. A method according to claim 33, wherein each scan flip-flop in the scan chain includes a timing input for receiving a scan timing signal being applied through a fourth external pin of the integrated circuit.

46. A method according to claim 33, wherein the trimming circuit is placed upstream of the scan chain.

47. A method according to claim 33, wherein the trimming circuit is placed downstream of the scan chain.

48. A method according to claim 33, wherein the plurality of scan flip-flops of the scan chain are divided into first and second blocks of scan flip-flops, and wherein the trimming circuit is connected between the first and second blocks.

* * * * *